US011756941B2

(12) United States Patent
Fallin et al.

(10) Patent No.: US 11,756,941 B2
(45) Date of Patent: Sep. 12, 2023

(54) ENHANCED DUMMY DIE FOR MCP

(71) Applicant: Intel Corporation, Santa Clara, CA (US)

(72) Inventors: John Fallin, Beaverton, OR (US); Daniel Willis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1007 days.

(21) Appl. No.: 16/379,607

(22) Filed: Apr. 9, 2019

(65) Prior Publication Data

US 2020/0328195 A1    Oct. 15, 2020

(51) Int. Cl.
| | |
|---|---|
| *H01L 23/50* | (2006.01) |
| *H01L 25/16* | (2023.01) |
| *H01L 23/00* | (2006.01) |
| *H01L 23/31* | (2006.01) |
| *H01L 23/42* | (2006.01) |
| *H01L 49/02* | (2006.01) |
| *H01L 23/522* | (2006.01) |
| *H01G 4/30* | (2006.01) |

(52) U.S. Cl.
CPC .......... *H01L 25/16* (2013.01); *H01L 23/3128* (2013.01); *H01L 23/42* (2013.01); *H01L 23/5223* (2013.01); *H01L 24/17* (2013.01); *H01L 28/40* (2013.01); *H01G 4/30* (2013.01); *H01L 2224/0401* (2013.01); *H01L 2924/1205* (2013.01)

(58) Field of Classification Search
CPC ..... H01L 23/50; H01L 23/5223; H01L 23/42; H01L 23/367; H01L 23/3128; H01L 25/16; H01L 28/40; H01L 24/17; H01L 2224/0401; H01L 2924/1205; H01G 4/30
See application file for complete search history.

(56) References Cited

U.S. PATENT DOCUMENTS

| | | | |
|---|---|---|---|
| 6,700,196 B1* | 3/2004 | Kautz | H01L 22/22 257/E21.526 |
| 2013/0221511 A1* | 8/2013 | Higgins, III | H01L 23/4334 438/122 |
| 2015/0325553 A1* | 11/2015 | Park | H01L 23/481 257/774 |
| 2017/0110407 A1* | 4/2017 | Chaware | H01L 23/5384 |
| 2017/0301653 A1* | 10/2017 | Frenette | H01L 25/0657 |

(Continued)

*Primary Examiner* — Vongsavanh Sengdara
(74) *Attorney, Agent, or Firm* — Schwabe, Williamson & Wyatt, P.C.

(57) ABSTRACT

Embodiments include semiconductor packages. A semiconductor package includes a plurality of dies on a package substrate, and a plurality of smart dies on the package substrate, where the plurality of smart dies include a plurality of interconnects and a plurality of capacitors. The semiconductor package also includes a plurality of routing lines coupled to the dies and the smart dies, where the routing lines are communicatively coupled to the interconnects of the smart dies, where each of the dies has at least two or more routing lines to communicatively couple the dies together, and where one of the routing lines is via the interconnects of the smart dies. The capacitors may be a plurality of metal-insulator-metal (MIM) capacitors. The dies may be a plurality of active dies. The routing lines may communicatively couple first and second active dies to first and second smart dies.

25 Claims, 6 Drawing Sheets

(56) References Cited

U.S. PATENT DOCUMENTS

2017/0301654 A1* 10/2017 Frenette .............. H01L 25/0657
2019/0042964 A1*  2/2019 Elsherbini ........... H01L 25/0652
2019/0103459 A1*  4/2019 Lu ..................... H01L 27/10894

* cited by examiner

ENHANCED DUMMY DIE FOR MCP

FIELD

Embodiments relate to packaging semiconductor devices. More particularly, the embodiments relate to semiconductor packages with active and dummy dies with multi-chip package (MCP) architectures.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. This also includes implementing various electrical components into a single semiconductor package, such as a multi-chip package (MCP) central processing unit (CPU). The necessity to optimize the bandwidth, the latency, and the power and signal integrity of MCP CPUs become increasingly significant.

Currently in the semiconductor industry, the MCP CPU is typically used to support a wide range of core counts in a scalable platform, which maintains the same socket and pinout across a full range of electronic devices. Typically, a single MCP package substrate may be designed with one or more dies that are populated as active dies, while the other dies are typically implemented as dummy dies. The combined active and dummy dies may communicate via die-to-die connections passed through the die bumps and the package substrate routing. The dummy dies, however, fail to provide an uninterrupted link through the dummy dies and the MCP package substrate. The loss of these uninterrupted links through the dummy dies therefore limit the die-to-die input/output (I/O) bandwidth and hinder the die-to-die bus structure.

Existing technologies may use a custom package substrate and design for each version of the MCPs (e.g., one active die, two active dies, etc.). This custom package substrate, however, requires designing and testing each unique combination of the MCPs, thereby increasing design costs, increasing development costs, and losing economy of scale.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages with active and dummy dies implemented in multi-chip package (MCP) architectures and methods of forming such semiconductor packages. As such, embodiments of the semiconductor packages described below enable a MCP package substrate to have a combination of active dies and dummy dies that are coupled with interconnect continuation structures.

Embodiments described herein improve packaging solutions by enabling a MCP semiconductor package to modify dummy dies with cost-efficient metal routings, which align with controlled collapse chip connection (C4) pads to provide die-to-die interconnect/bus continuation structures (e.g., as shown with the interconnects 111 of FIGS. 1A-1C), thereby leading to increased die-to-die interconnect bandwidth, improved memory access bandwidth, and reduced latency. These embodiments are even-more critical to the improvement of packaging solutions as MCP semiconductor packages scale-up in core count.

In existing technologies, a dummy die typically refers to a die that may not be functional, activated, and/or enabled. As described herein, a "dummy die" may refer to a die that is not an active die—or may have substantially fewer functionalities than the active die. Additionally, as described herein, the dummy die may be improved (or designed) into a "continuation die", which may refer to a die implemented with interconnect continuation structures to improve die-to-die input/output (I/O) bandwidth (e.g., by improving access of the cores on the second die to resources coupled to the first die, such as the double date rate (DDR) and/or peripheral component interconnect express (PCIe) interconnects/busses). Furthermore, as described herein, the dummy die may be improved into a "smart die" (or an "enhanced smart die"), which may refer to a die implemented with interconnect continuation structures, metal-insulator-metal (MIM) capacitors, multilayered ceramic chip (MLCC) capacitors, and/or thin coreless substrates to improve power and signal integrity performance (e.g., by providing a low inductance decoupling solution to reduce active die power rail voltage fluctuations).

Figure 1A:
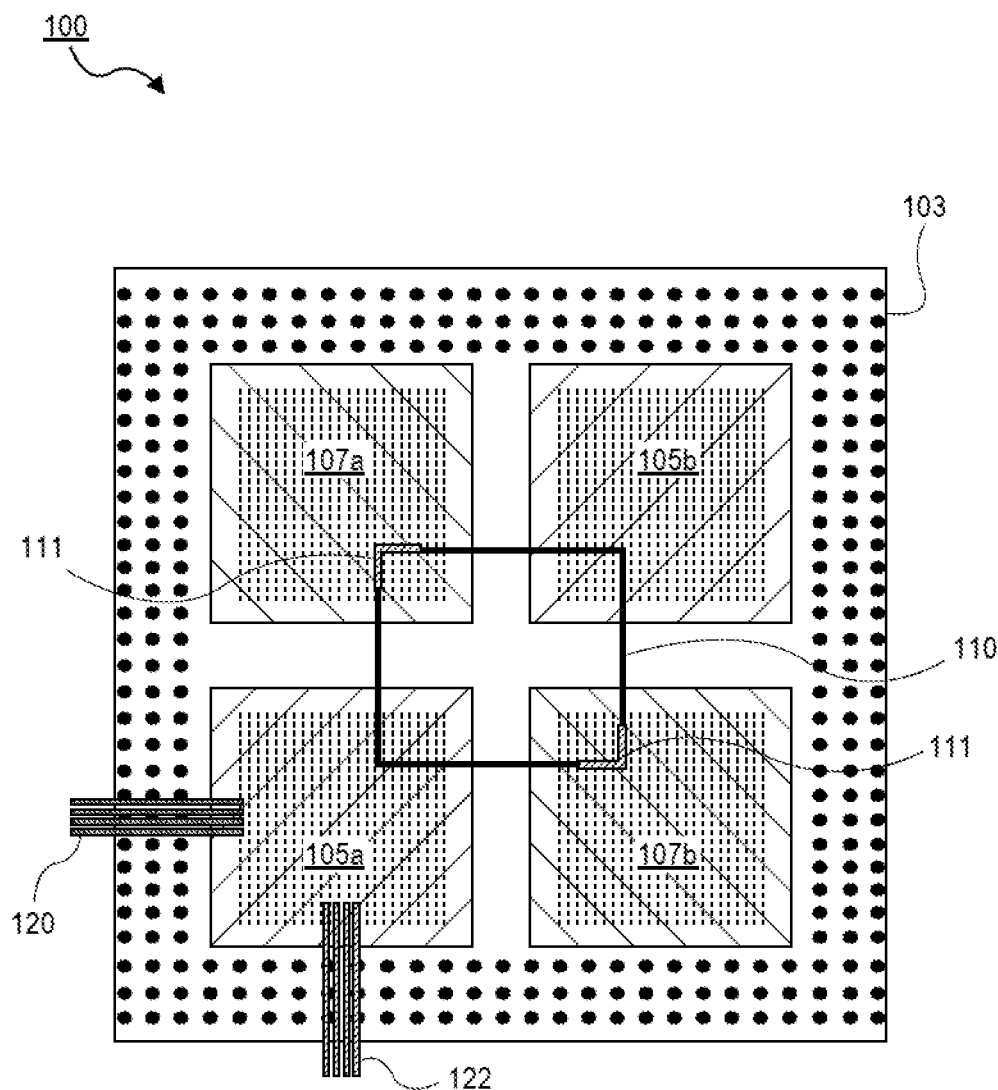
FIG. 1A is an illustration of a plan view of a multi-chip package (MCP) semiconductor package having a package substrate with a plurality of dies, a plurality of continuation dies, and a plurality of interconnect continuation structures, according to one embodiment.
Figure 1B:
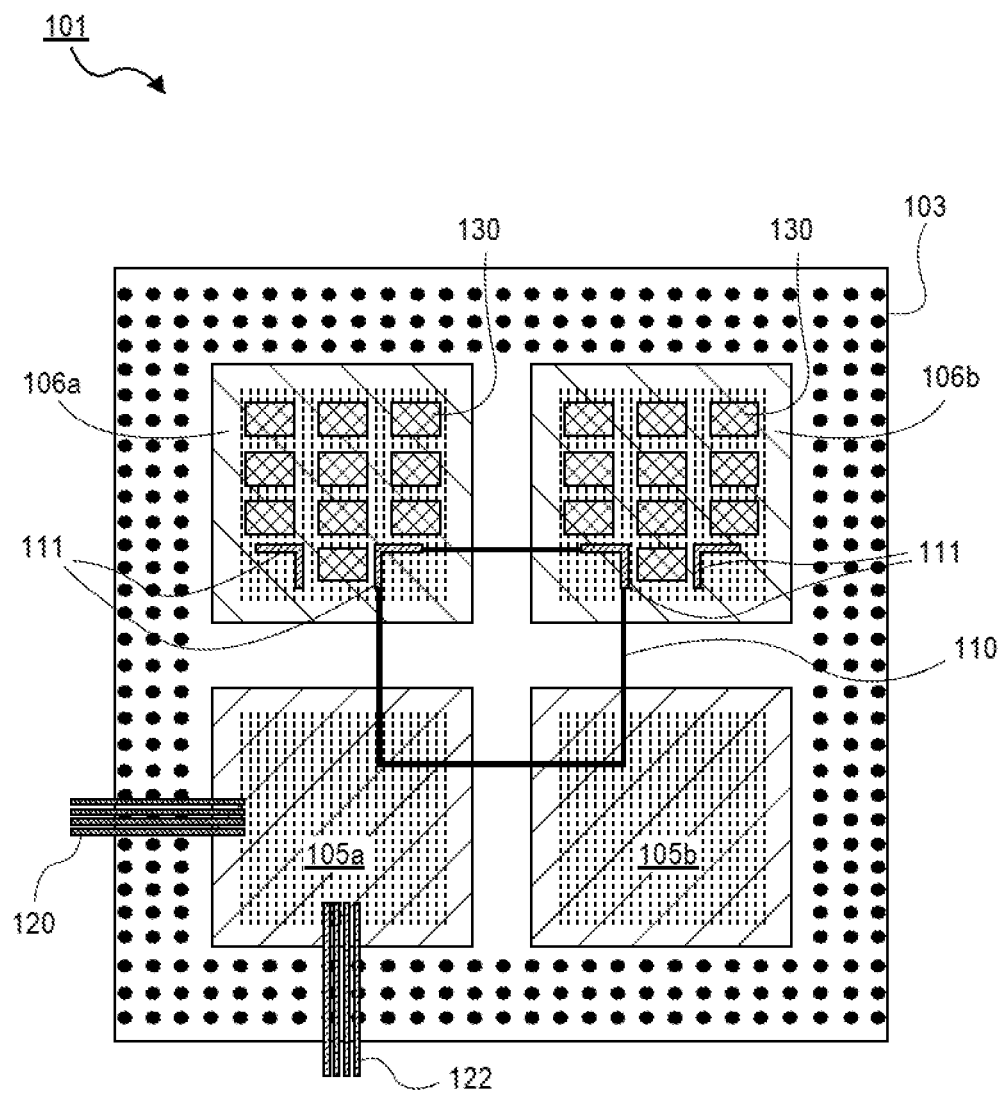
FIG. 1B is an illustration of a plan view of a MCP semiconductor package having a package substrate with a plurality of dies, a plurality of smart dies, and a plurality of interconnect continuation structures, according to one embodiment.
Figure 1C:
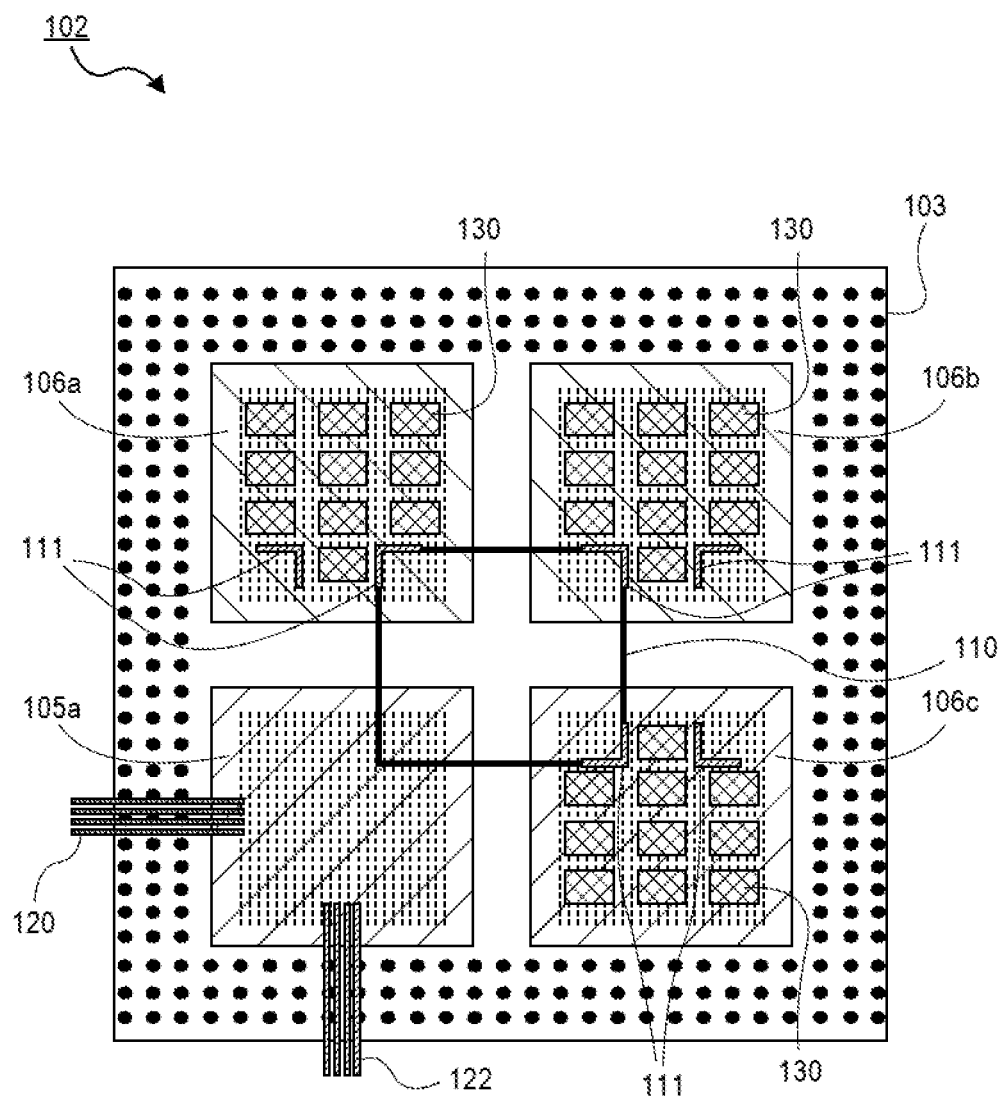
FIG. 1C is an illustration of a plan view of a MCP semiconductor package having a package substrate with a plurality of dies, a plurality of smart dies, and a plurality of interconnect continuation structures, according to one embodiment.

Additionally, embodiments described herein improve packaging solutions by enabling a MCP semiconductor package to modify dummy dies with MIM capacitors to improve power integrity of a nearby active die, thereby leading to improved power rail performance (e.g., as shown with the capacitors 130 of FIGS. 1B-1C). In some embodiments, a MCP semiconductor package described herein may replace (or enhance) a dummy die with a low-cost thin, coreless substrate that is populated with high-frequency decoupling capacitors (and/or high-frequency decoupling MLCC capacitors) to improve the power integrity of a nearby active die, thereby leading improved signal integrity analysis performance (e.g., as shown with the capacitors 330 and 430 of FIGS. 3-4). These capacitors will be especially effective due to the low inductance between the capacitors and the active die power pads.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including MCP semiconductor packages with a plurality of dies, a plurality of smart dies, and a plurality of interconnect continuation structures.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lower-most element" or "bottom element" in the device may instead form the "uppermost element" or "top element" in the device when the device is inverted.

FIGS. 1A-1C are a series of plan illustrations that depict a plurality of semiconductor packages 100-102 (or a plurality of MCP semiconductor packages), where each semiconductor package 100-102 may have a combination of dies 105a-b (or active dies), continuation dies 107a-b, and/or smart dies 106a-c, in accordance with an embodiment. As described above, each of the FIGS. 1A-1C illustrates one of the approaches that enables the MCP semiconductor packages 100-102 to provide increased die-to-die interconnect bandwidth, improved memory access bandwidth, reduced latency, and improved power and signal integrity performance.

Referring now to FIG. 1A, a plan illustration of a semiconductor package 100 is shown, in accordance with an embodiment. In an embodiment, the semiconductor package 100 may include a plurality of dies 105a-b and a plurality of continuation dies 107a-b on a package substrate 103. For example, as shown in FIG. 1A, the package substrate 103 may position two dies 105a-b diagonal to each other, while two continuation dies 107a-b are also positioned diagonal to each other and adjacent to the dies 105a-b. While two dies 105a-b and two continuation dies 107a-b are illustrated, it is to be appreciated that any number (or combination) of dies 105a-b and continuation dies 107a-b may be disposed (or formed/positioned) on the package substrate 103.

For one embodiment, the package substrate 103 may include, but is not limited to, a package, a substrate, a printed circuit board (PCB), and a motherboard. For one embodiment, the package substrate 103 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 103. For one embodiment, the PCB 103 may also include conductive layers that comprise copper traces, metallic pads (e.g., C4 pads), vias, via pads, planes, and/or holes. In one embodiment, thermal interface material (TIM) layers may be disposed on the top surfaces of the dies 105a-b and 107a-b, while an integrated heat spreader (IHS) may be disposed over the TIM layers above the dies 105a-b and 107a-b (e.g., as shown with the TIM layers 240 and the IHS 250 of FIG. 2).

In an embodiment, the dies 105a-b may be a system on chip (SoC) die. For example, the dies 105a-b may also be a microelectronic device, a semiconductor die, an integrated circuit (IC), a central processing unit (CPU), a microprocessor, a platform controller hub (PCH), a memory, and/or a field-programmable gate array (FPGA). In an embodiment, as described above, the continuation dies 107a-b may be a die having an interconnect 111, where the interconnect 111 may be an interconnect continuation structure.

In one embodiment, the interconnect 111 may be used as a bus continuation structure that enables the die-to-die link between the continuation dies 107a-b and the dies 105a-b to be kept open (or uninterrupted/unbroken). For one embodiment, the interconnect 111 may be a conductive routing interconnect (or a conductive routing continuation interconnect) comprised of a plurality of I/O interconnects that are aligned with the C4 pads of the package substrate 103. For example, the conductive routing interconnect 111 may include a plurality of I/O interconnect signals that are continually routed from one end of the continuation die 107a-b to the other end of the continuation die 107a-b.

As shown in FIG. 1A, a plurality of routing lines 110 may couple the dies 105a-b and the continuation dies 107a-b, according to some embodiments. In one embodiment, the interconnect 111 of the continuation die 107a may be used to couple the die 105a to the die 105b with the routing lines 110. Moreover, the interconnect 111 of the continuation die 107b may be used to couple the die 105b to the die 105a with the routing lines 110, according to one embodiment.

Accordingly, the interconnects 111 and the routing lines 110 may be coupled to each other and the dies 105a-b and 107a-b, enabling the die-to-die link between the dies 105a-b to be kept open (or unbroken). That is, the routing lines 110 may be communicatively coupled to the interconnects 111 of the continuation dies 107a-b, and each of the dies 105a-b may have at least two or more routing lines 110 to communicatively couple the dies 105a-b together, such that at least one of the routing lines 110 is via the interconnects 111 of the continuation dies 107a-b. This enables each of the dies 105a-b to have at least two or more communication paths (or links) that communicatively couple the dies 105a-b together, where one of the communication paths passes through the interconnects 111 of the continuation dies 107a-b, thereby providing a continuous/unbroken die-to-die link (or signal link) between the dies 105a-b and 107a-b to increase the interconnect I/O bandwidth and memory access bandwidth—while also reducing the signal latency—of the semiconductor package 100. Additionally, by having the dies 105a-b and the continuation dies 107a-b positioned diagonally to each other, the semiconductor package 100 does not lose the die-to-die connections between the two active dies 105a-b (i.e., the continuation dies 107a-b enable the die-to-die connections between the two active dies 105a-b to stay open) and improves the thermal budget by spreading the heat on the package substrate.

For example, in some embodiments, by replacing dummy dies with the continuation dies 107a-b with the interconnects 111, the semiconductor package 100 may double the die-to-die I/O bandwidth of the dies 105a-b, and enable the cores (e.g., approximately 8 to 64 cores) of the die 105b to access the linked resources (or the available resources) of the coupled first die 105a (and/or vice-versa), including but not limited to a PCIe bus 120 and a DDR bus 122. In other embodiments, the dies 105a-b may have additional linked resources that may be available to each of the dies 105a-b using the continuation dies 107a-b with the interconnects 111. For some embodiments, the dies 105a-b and the continuation dies 107a-b may be implemented using the same manufacturing process. Note that, for an alternate embodiment, a continuation die may be implemented using an older manufacturing process to further reduce costs and offer factory utilization optimizations.

Also note that the semiconductor package 100 as shown in FIG. 1A may include fewer or additional packaging components based on the desired packaging design.

Referring now to FIG. 1B, a plan illustration of a semiconductor package 101 is shown, in accordance with an embodiment. The semiconductor package 101 may be substantially similar to the semiconductor package 100 of FIG. 1A, with the exception that a plurality of smart dies 106a-b are disposed on the package substrate 103. For example, as shown in FIG. 1B, the package substrate 103 may position two dies 105a-b on one end, while two smart dies 106a-b are positioned on the opposite end. While two dies 105a-b and two smart dies 106a-b are illustrated, it is to be appreciated that any number (or combination) of dies 105a-b and smart dies 106a-b may be disposed on the package substrate 103. Similar to the MCP semiconductor package above, interconnects 111 may be disposed (or formed) on the smart dies 106a-b.

In an embodiment, the semiconductor package 101 may include a plurality of dies 105a-b and a plurality of smart dies 106a-b on a package substrate 103. The package substrate 103 may be substantially similar to the package substrate 103 of FIG. 1A. In one embodiment, TIM layers may be disposed on the top surfaces of the dies 105a-b and 106a-b, while an IHS may be disposed over the TIM layers above the dies 105a-b and 106a-b (e.g., as shown with the TIM layers 240 and the IHS 250 of FIG. 2). The dies 105a-b may be substantially similar to the dies 105a-b of FIG. 1A. In an embodiment, as described above, the smart dies 106a-b may be a die (or a continuation die) having a plurality of interconnects 111 and a plurality of MIM capacitors 130.

For one embodiment, the MIM capacitors 130 may be disposed (or formed) on the smart dies 106a-b to improve the power and signal integrity performance of the semiconductor package 101 by providing a low inductance decoupling solution that reduces the first droop impedance. In one embodiment, the MIM capacitors 130 may be parallel conductive plates with a dielectric layer between the plates and/or any other similar type of capacitors (e.g., MLCC and so on). For one embodiment, the smart dies 106a-b may implement the MIM capacitors 130 to have a z-height that may be substantially the same as a z-height of the dies 105a-b, accordingly the MIM capacitors 130 are coupled to the power and ground layers of the package substrate 103 in substantially the same z-height (or z-plane) as the dies 105a-b, thereby providing a low inductance decoupling loop/path with a lowered first droop for the semiconductor package 101.

In some embodiments, as described above, the interconnect 111 may be used as a bus continuation structure that enables the die-to-die link between the smart dies 106a-b and the dies 105a-b to be kept open. The interconnects 111 may be substantially similar to the interconnects 111 of FIG. 1A, with the exception that more than one interconnect 111 are disposed on the one or more of the edges (or corners) of the smart dies 106a-b. This enables the smart die 106a-b to couple to at least two or more dies with the two interconnects 111 positioned on at least two of the corners of the smart die 106a-b.

As shown in FIG. 1B, a plurality of routing lines 110 may couple the dies 105a-b and the smart dies 106a-b, according to some embodiments. In one embodiment, the interconnect 111 of the smart die 106a may be used to couple the die 105a to the smart die 106b with the routing lines 110. Moreover, the interconnect 111 of the smart die 106b may be used to couple the die 105b to the smart die 106a with the routing lines 110, according to one embodiment.

Accordingly, the interconnects 111 and the routing lines 110 may be coupled to each other and the dies 105a-b and the smart dies 106a-b with the MIM capacitors 130, enabling the die-to-die link between the dies 105a-b to be maintained unbroken. That is, the routing lines 110 may be communicatively coupled to the interconnects 111 of the smart dies 106a-b, and each of the dies 105a-b may have at least two or more routing lines 110 to communicatively couple the dies 105a-b together, such that at least one of the routing lines 110 is via the interconnects 111 of the smart dies 106a-b. This enables each of the dies 105a-b to have at least two or more communication paths (or links) that communicatively couple the dies 105a-b together, where one of the communication paths passes through the interconnects 111 of the smart dies 106a-b, thereby providing a continuous/unbroken die-to-die link (or signal link) between the dies 105a-b and 106a-b to increase the interconnect I/O bandwidth, memory access bandwidth, and power integrity—while also reducing the signal latency, the inductance path, and the first droop impedance—of the semiconductor package 101.

For example, in some embodiments, by replacing dummy dies with the smart dies 106a-b with the interconnects 111 and the MIM capacitors 130, the semiconductor package 101 may double the die-to-die I/O bandwidth of the dies 105a-b, enable the plurality of cores of the die 105b to access the linked resources of the coupled first die 105a (and/or vice-versa) such as, but not limited to, a PCIe bus 120 and a DDR bus 122, and improve the impedance, power and signal integrity performance. In other embodiments, the dies 105a-b may have additional linked resources that may be available to each of the dies 105a-b using the smart dies 106a-b with the interconnects 111. For some embodiments, the dies 105a-b and the smart dies 106a-b may be implemented using the same manufacturing process. Note that, for an alternate embodiment, a smart die may be implemented using an older manufacturing process to further reduce costs and offer factory utilization optimizations.

Also note that the semiconductor package 101 as shown in FIG. 1B may include fewer or additional packaging components based on the desired packaging design.

Referring now to FIG. 1C, a plan illustration of a semiconductor package 102 is shown, in accordance with an embodiment. The semiconductor package 102 may be substantially similar to the semiconductor package 101 of FIG. 1B, with the exception that three smart dies 106a-c are disposed on the package substrate 103. For example, as shown in FIG. 1C, the package substrate 103 may position one die 105a on one edge, while the three smart dies 106a-c are positioned on the other three edges. While one die 105a and three smart dies 106a-c are illustrated, it is to be appreciated that any number (or combination) of die 105a and smart dies 106a-c may be disposed on the package substrate 103. Similar to the MCP semiconductor packages above, interconnects 111 may be disposed (or formed) on the smart dies 106a-c.

In an embodiment, the semiconductor package 102 may include a die 105a and a plurality of smart dies 106a-c on a package substrate 103. The package substrate 103 may be substantially similar to the package substrate 103 of FIG. 1B. In one embodiment, TIM layers may be disposed on the top surfaces of the dies 105a and 106a-c, while an IHS may be disposed over the TIM layers above the dies 105a and 106a-c (e.g., as shown with the TIM layers 240 and the IHS 250 of FIG. 2). The die 105a may be substantially similar to the die 105a of FIG. 1B. The smart dies 106a-c with the MIM capacitors 130 may be substantially similar to the smart dies 106a-b with the MIM capacitors 130 of FIG. 1B.

In some embodiments, as described above, the interconnect 111 may be used as a bus continuation structure that enables the die-to-die link between the smart dies 106a-c and the die 105a to be kept open. The interconnects 111 may be substantially similar to the interconnects 111 of FIG. 1B. As shown in FIG. 1C, a plurality of routing lines 110 may couple the die 105a and the smart dies 106a-c, according to some embodiments. In one embodiment, the interconnect 111 of the smart die 106a may be used to couple the die 105a to the smart die 106b with the routing lines 110. Moreover, the interconnect 111 of the smart die 106b may be used to couple the smart die 106c to the smart die 106a with the routing lines 110, according to one embodiment. Additionally, the interconnect 111 of the smart die 106c may be used to couple the smart die 106b to the die 105a with the routing lines 110, according to one embodiment.

Accordingly, the interconnects 111 and the routing lines 110 may be coupled to each other and the die 105a and the smart dies 106a-c with the MIM capacitors 130, enabling the die-to-die link between each of the dies 105a and 106a-c to be maintained unbroken. That is, the routing lines 110 may be communicatively coupled to the interconnects 111 of the smart dies 106a-c, and the die 105a may have at least two or more routing lines 110 to communicatively couple the dies 105a and 106a-c together, such that at least one of the routing lines 110 is via the interconnects 111 of the smart dies 106a-c. This enables the die 105a to have at least two or more communication paths (or links) that communicatively couple the dies 105a and 106a-c together.

For example, in some embodiments, by replacing dummy dies with the smart dies 106a-c with the interconnects 111 and the MIM capacitors 130, the semiconductor package 102 may enable the plurality of cores of other dies (not shown)—that may be coupled with the additional interconnects 111 of the smart dies 106a-c—to access the linked resources of the die 105a (and/or vice-versa), including, but not limited to, a PCIe bus 120 and a DDR bus 122, thereby improving the bandwidth, the impedance, and the power and signal integrity performance.

Note that the semiconductor package 102 as shown in FIG. 1C may include fewer or additional packaging components based on the desired packaging design.

Figure 2:
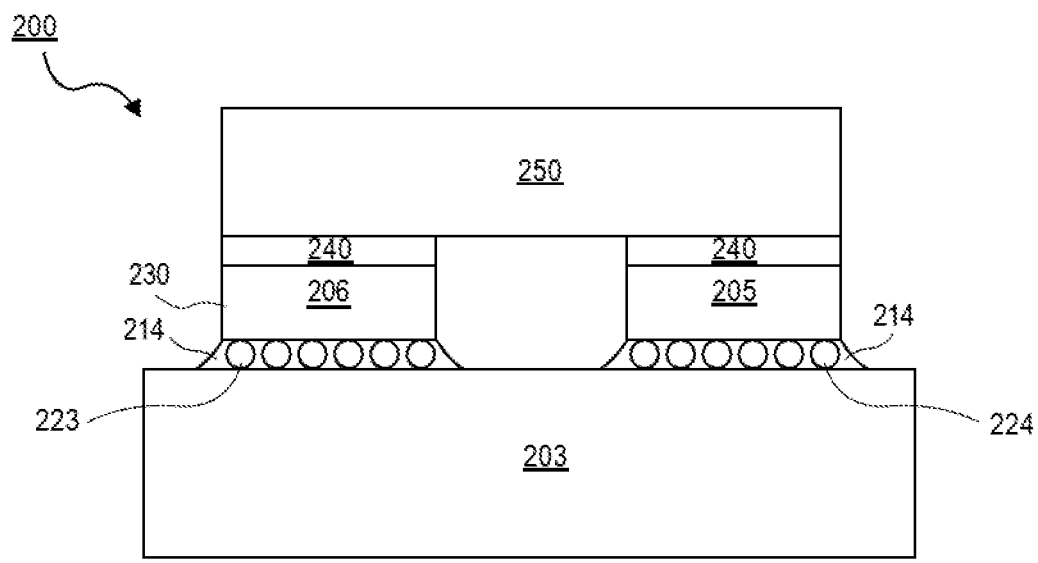
FIG. 2 is an illustration of a cross-sectional view of a MCP semiconductor package having a package substrate with a die, a smart die with, an integrated heat spreader (IHS), thermal interface material (TIM) layers, and a plurality of interconnect continuation structures, according to one embodiment.

Referring now to FIG. 2, a cross-sectional illustration of a semiconductor package 200 is shown, in accordance with an embodiment. The semiconductor package 200 may be substantially similar to the semiconductor package 101 of FIG. 1B, with the exception that a plurality of TIM layers 240 (or a plurality of TIMs) and an IHS 250 are disposed over a package substrate 203. For example, as shown in the cross-sectional illustration of FIG. 2, a die 205 and a smart die 206 may be disposed on the package substrate 203, where the IHS 250 and the TIM layers 240 may be respectively disposed on the top surfaces of dies 205-206. While one die 205 and one smart die 206 are illustrated, it is to be appreciated that any number (or combination) of dies 205 and smart dies 206 may be disposed on the package substrate 203. Similar to the MCP semiconductor packages above, a plurality of interconnects (e.g., the interconnects 111 of FIG. 1B) may be disposed on the smart die 206.

In an embodiment, the die 205 and the smart die 206 may be coupled on the package substrate 203 with a plurality of solder balls 224 and 223, respectively. The package substrate 203 may be substantially similar to the package substrate 103 of FIG. 1B. In one embodiment, the package substrate 203 may have a thickness of approximately 2 mm or less. Additionally, in one embodiment, an underfill material 214 may surround the solder balls 223-224 and portions of the dies 205-206. The die 205 may be substantially similar to the dies 105a-b of FIG. 1B. The smart die 206 with the MIM capacitors 230 and interconnects (not shown) may be substantially similar to the smart dies 106a-b with the MIM capacitors 130 and interconnects 111 of FIG. 1B.

For some embodiments, the TIM layers 240 may be disposed on the top surfaces of the die 205 and smart dies 206 to dissipate the heat from the dies 205-206 to the IHS 250. For some embodiments, the TIM layers 240 may be disposed on the dies 205-206 to thermally (and/or mechanically) couple the dies 205-206 to the IHS 250. In one embodiment, the TIM layers 240 may include, but are not limited to, a polymer TIM (PTIM), an epoxy, a liquid phase sintering (LPS) paste, a solder paste, a solder TIM (STIM), and/or any other thermal interface material(s). For one embodiment, a thickness of the TIM 240 on the die 205 may be substantially equal to a thickness of the TIM 240 on the smart die 206. For another embodiment, a thickness of the TIM 240 on the die 205 may be different than a thickness of the TIM 240 on the smart die 206 (i.e., in addition to their heat dissipation functions, the TIMs 240 may be used to compensate for a z-height variation in the one or more dies 205-206). In one embodiment, the TIM layers 240 may have a thickness that is approximately 220 um or less.

In one embodiment, the IHS 250 may be a flat lid that is coupled to the dies 205-206 with the TIM layers 240. The IHS 250 may cover the x-y area of the package substrate 203 that is occupied with the dies 205-206. For example, as shown in a plan view of FIG. 1B, the dies 105a-b and 106a-b may occupy an x-y area of the package substrate 103, accordingly an IHS, such as the IHS 250 of FIG. 2, may have an x-y area that is substantially equal to the x-y area of the dies 105a-b and 106a-b. In one embodiment, the IHS 250 may be formed from a thermally conductive material, such as metal and/or any other thermally conductive material. For example, the IHS 250 may include, but is not limited to, copper, aluminum, steel, nickel, and/or one or more metal alloys.

As described above, the MIM capacitors 230 may be disposed (or formed) on the smart dies 206 to improve the power and signal integrity performance of the semiconductor package 200 by providing a low inductance decoupling solution that reduces the first droop impedance. The MIM capacitors 230 may be substantially similar to the MIM capacitors 130 of FIG. 1B. In one embodiment, the smart die 206 may have a thickness that is substantially equal to a thickness of the die 205. Accordingly, for some embodiments, the MIM capacitors 230 of the smart die 206 are coupled to the power and ground layers of the package substrate 203 in substantially the same z-height (or z-plane) as the die 205 to enable improving the inductance decoupling path and first droop impedance of the semiconductor package 200.

In some embodiments, the one or more smart dies 206 may have interconnects that may be used as bus continuation structures that enable the die-to-die link between the dies 205-206 to be kept open. The interconnects may be substantially similar to the interconnects 111 of FIG. 1B. In addition, the package substrate 203 may have a plurality of routing lines that may couple the die(s) 205 and the smart die(s) 206 (e.g., as shown with the routing lines 110 of FIG. 1B), according to some embodiments. In one embodiment, the interconnects and routing lines may be used to couple the die(s) 205 and the smart die(s) 206.

Note that the semiconductor package 200 may include fewer or additional packaging components based on the desired packaging design.

Figure 3:
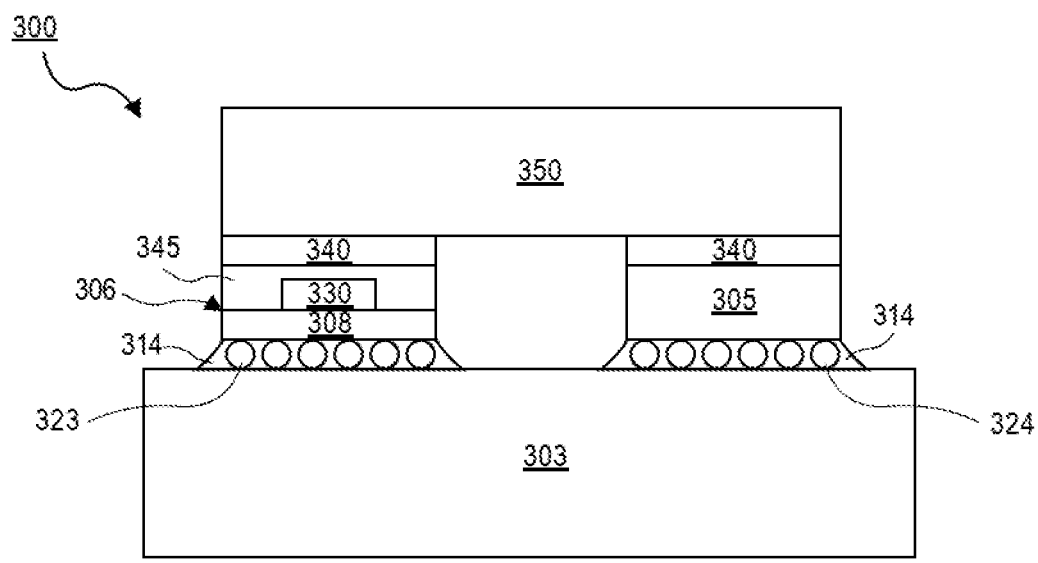
FIG. 3 is an illustration of a cross-sectional view of a MCP semiconductor package having a package substrate with a die, an enhanced smart die with, an IHS, a TIM layer, and a plurality of interconnect continuation structures, according to one embodiment.

Referring now to FIG. 3, a cross-sectional illustration of a semiconductor package 300 is shown, in accordance with an embodiment. The semiconductor package 300 may be substantially similar to the semiconductor packages 101 and 200 of FIGS. 1B and 2, with the exception that a smart die 306 has a capacitor 330 disposed on a substrate 308, and the smart die 306 also has an encapsulation layer 345 disposed over the capacitor 330 and the substrate 308. For example, as shown in the cross-sectional illustration of FIG. 3, the smart die 306 includes the capacitor 330 that may be embedded in the encapsulation layer 345 and disposed on the substrate 308. While one die 305 and one smart die 306 are illustrated, it is to be appreciated that any number (or combination) of dies 305 and smart dies 306 may be disposed on the package substrate 303. Similar to the MCP semiconductor packages above, a plurality of interconnects (e.g., the interconnects 111 of FIG. 1B) may be disposed on the smart die 306.

In an embodiment, the die 305 and the smart die 306 may be coupled on the package substrate 303 with a plurality of solder balls 324 and 323, respectively. The package substrate 303 may be substantially similar to the package substrate 103 of FIG. 1B. Additionally, in one embodiment, an underfill material 314 may surround the solder balls 323-324 and portions of the dies 305-306, which may include portions of the encapsulation layer 345 and the substrate 308.

The die 305 may be substantially similar to the dies 105a-b of FIG. 1B. The smart die 306 with the interconnects (not shown) may be substantially similar to the smart dies 106a-b with the interconnects 111 of FIG. 1B, with the exception that the capacitor 330 is embedded in the encapsulation layer 345 and disposed on the substrate 308 to improve the power integrity of the semiconductor package 300. That is, unlike the MIM capacitors 230 of the smart die 206 of FIG. 2, the capacitor 330 of the smart die 306 may be a high-frequency decoupling capacitor (or the like), such as a high-frequency decoupling MLCC, according to one embodiment. In one embodiment, the substrate 308 of the smart die 306 may be a thin, coreless substrate with microvias that may use the same C4 bump map as the die 305. For one embodiment, the encapsulation layer 345 may be a mold layer, a sealant layer, and/or the like. In one embodiment, the encapsulation layer 345 may be implemented as a combined capacitor epoxy encapsulation and TIM material, which may provide a mechanical and thermal attach from the smart die 306 to the IHS 350.

Additionally, by disposing (or adding) the capacitor 330 on the substrate 308, the semiconductor package 300 may implement this illustrated design to only cover the power and the voltage source supply ($V_{SS}$) to reduce the x-y area and costs, according to one embodiment. Alternatively, in an optional embodiment, the semiconductor package 300 may implement a similar design to only cover portions of the I/O routing lines of continuation dies that are used as pass-through interconnects in certain die configurations that may use two interconnect busses per die.

For some embodiments, the TIM layers 340 may be disposed on the top surfaces of both dies 305-306, where one of the TIM layers 340 may be disposed over the encapsulation layer of the smart die 306. The TIM layer 340 may be substantially similar to the TIM layer 240 of FIG. 2. In one embodiment, a top surface of TIM layer 340 over the smart die 306 may be substantially coplanar to a top surface of the TIM layer 340 over the die 305, where both of the top surfaces of the TIM layers 340 are coupled to the IHS 350. The IHS 350 may be substantially similar to the IHS 250 of FIG. 2. In one embodiment, the IHS 350 may have a thickness that is approximately 3 mm or less.

In some embodiments, the one or more smart dies 306 may have interconnects that may be used as bus continuation structures that enable the die-to-die link between the one or more dies 305-306 to be kept open. The interconnects may be substantially similar to the interconnects 111 of FIG. 1B. In addition, the package substrate 303 may have a plurality of routing lines that may couple the die(s) 305 and the smart die(s) 306 (e.g., as shown with the routing lines 110 of FIG. 1B), according to some embodiments. In one embodiment, the interconnects and routing lines may be used to couple the die(s) 305 and the smart die(s) 306.

Note that the semiconductor package 300 may include fewer or additional packaging components based on the desired packaging design.

Figure 4:
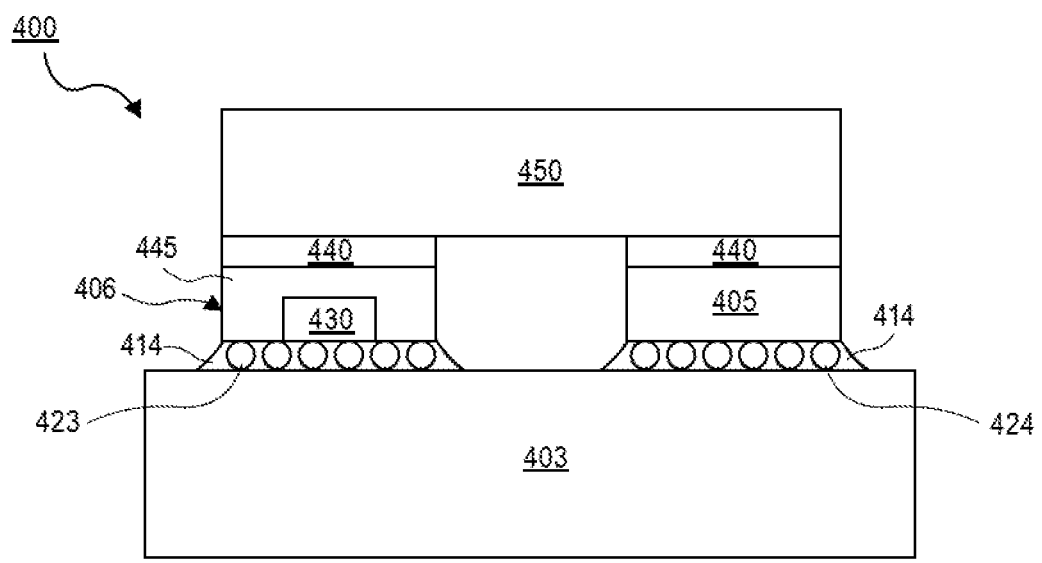
FIG. 4 is an illustration of a cross-sectional view of a MCP semiconductor package having a package substrate with a die, an enhanced smart die with, an IHS, TIM layers, and a plurality of interconnect continuation structures, according to one embodiment.

Referring now to FIG. 4, a cross-sectional illustration of a semiconductor package 400 is shown, in accordance with an embodiment. The semiconductor package 400 may be substantially similar to the semiconductor packages 101, 200, and 300 of FIGS. 1B, 2, and 3, with the exception that a smart die 406 has a capacitor 430 disposed directly on the package substrate 403 without using a thin, coreless substrate (e.g., the substrate 308 of FIG. 3). For example, as shown in the cross-sectional illustration of FIG. 4, the smart die 406 includes the capacitor 430 that may be embedded in the encapsulation layer 445 and coupled directly to the package substrate 403 with the solder balls 423. While one die 405 and one smart die 406 are illustrated, it is to be appreciated that any number (or combination) of dies 405 and smart dies 406 may be disposed on the package substrate 403. Similar to the MCP semiconductor packages above, a plurality of interconnects (e.g., the interconnects 111 of FIG. 1B) may be disposed on the smart die 406.

In an embodiment, the die 405 and the smart die 406 may be coupled on the package substrate 403 with a plurality of solder balls 424 and 423, respectively. The package substrate 403 may be substantially similar to the package substrate 103 of FIG. 1B. Additionally, in one embodiment, an underfill material 414 may surround the solder balls 423-424 and portions of the dies 405-406, which may include portions of the encapsulation layer 445.

The die 405 may be substantially similar to the dies 105*a*-*b* of FIG. 1B. The smart die 406 with the capacitors 430 and interconnects (not shown) may be similar to the smart dies 306 with the capacitors 330 and interconnects of FIG. 3, with the exception that the smart die 406 may be implemented with footprints for high-frequency decoupling MLCC capacitors 430 that may substantially match the C4 bump patterns of the power and ground of the package substrate 403 to improve the power and signal integrity analysis performance of the semiconductor package 400. Note that, in one embodiment, this implementation of the capacitor 430 of the smart die 406 may limit the continuation of the bus-to-bus interface as described herein.

In one embodiment, unlike the capacitor 330 of the smart die 306 of FIG. 3, the capacitor 430 of the smart die 406 may be a high-frequency decoupling MLCC capacitor (or the like) that is directly disposed on the package substrate 403, where both the capacitor 430 and the package substrate 403 may be coupled to each other using matching (or substantially similar) power and ground C4 patterns, according to one embodiment. For one embodiment, the encapsulation layer 445 may be a mold layer, a sealant layer, and/or the like.

For some embodiments, the TIM layers 440 may be disposed on the top surfaces of the dies 405-406, where the TIM layer 440 may be disposed over the encapsulation layer 445 of the smart die 406. The TIM layers 440 may be substantially similar to the TIM layers 240 of FIG. 2. The IHS 450 may be substantially similar to the IHS 250 of FIG. 2.

In some embodiments, the one or more smart dies 406 may have interconnects that may be used as bus continuation structures that enable the die-to-die link between the one or more dies 405-406 to be kept open. The interconnects may be substantially similar to the interconnects 111 of FIG. 1B. In addition, the package substrate 403 may have a plurality of routing lines that may couple the die(s) 405 and the smart die(s) 406 (e.g., as shown with the routing lines 110 of FIG. 1B), according to some embodiments. In one embodiment, the interconnects and routing lines may be used to couple the die(s) 405 and the smart die(s) 406.

Note that the semiconductor package 400 may include fewer or additional packaging components based on the desired packaging design.

Figure 5:
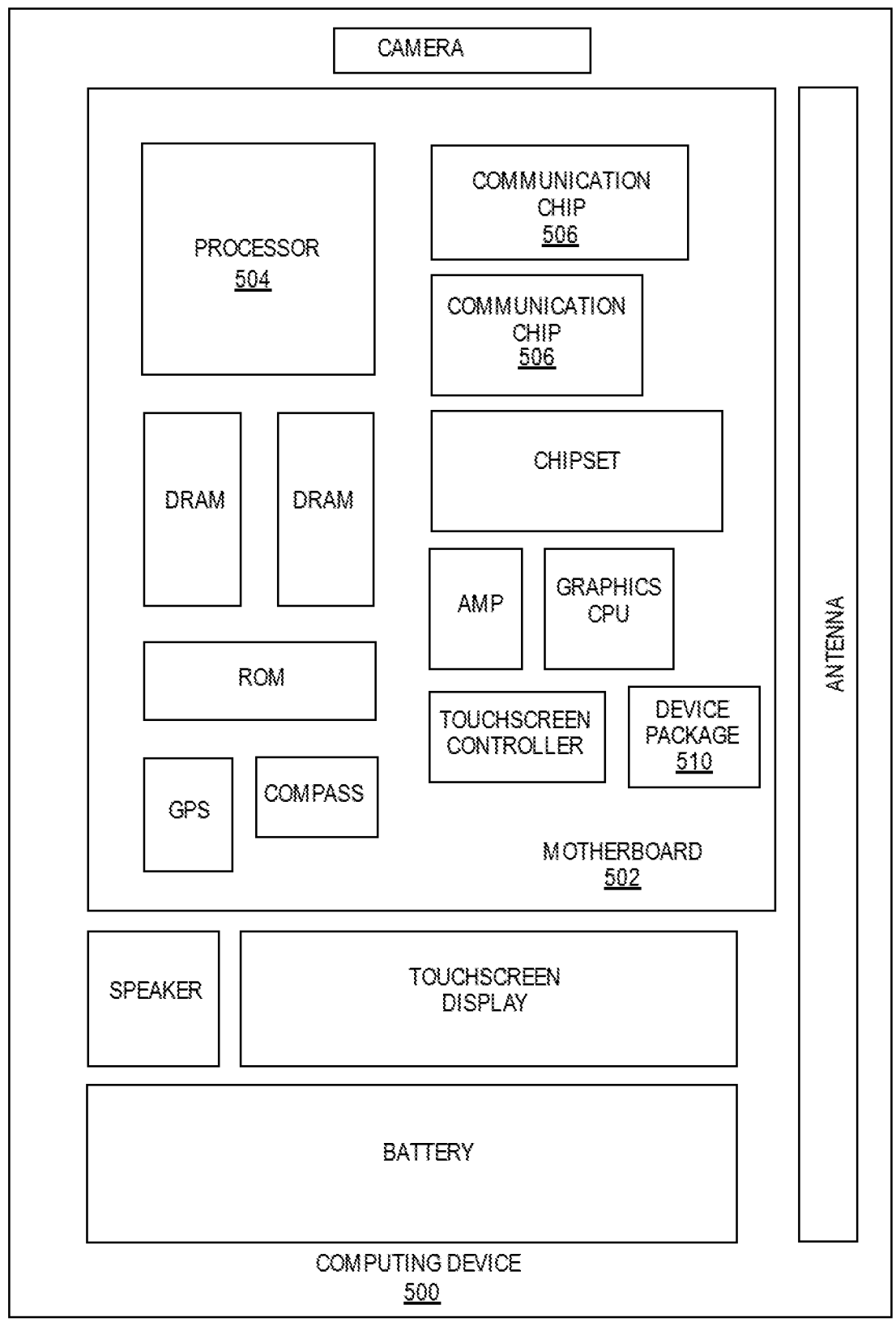
FIG. 5 is an illustration of a schematic block diagram illustrating a computer system that utilizes a MCP semiconductor package having a package substrate with a plurality of dies, a plurality of smart dies, and a plurality of interconnect continuation structures, according to one embodiment.

FIG. 5 is an illustration of a schematic block diagram illustrating a computer system that utilizes a MCP semiconductor package having a package substrate with a plurality of dies, a plurality of smart dies, and a plurality of interconnect continuation structures, according to one embodiment. FIG. 5 is an illustration of a schematic block diagram illustrating a computer system 500 that utilizes a device package 510 (or a MCP semiconductor package) with a package substrate with a plurality of dies, a plurality of smart dies, and a plurality of interconnect continuation structures, according to some embodiments. FIG. 5 illustrates an example of computing device 500.

Computing device 500 houses motherboard 502. Motherboard 502 may include a number of components, including but not limited to processor 504, device package 510 (or MCP semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a package substrate, and/or a PCB. Device package 510 may be a MCP semiconductor package having a package substrate with dies and smart dies (or continuation dies) with capacitors and/or interconnects (e.g., as illustrated in FIGS. 1A-4)—or any other components from the figures described herein. The device package 510 of the computing device 500 may be implemented with the MCP architectures as described herein.

Note that device package 510 may be a single component/device, a subset of components, and/or an entire system, as the materials, features, and components may be limited to device package 510 and/or any other component of the computing device 500 that may need the MCP architectures (e.g., the motherboard 502, the processor 504, and/or any other component of the computing device 500 that may need the MCP semiconductor packages (or components/structures) as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a plurality of dies on a package substrate; a plurality of smart dies on the package substrate, wherein the plurality of smart dies include a plurality of interconnects and a plurality of capacitors; and a plurality of routing lines coupled to the plurality of dies and the plurality of smart dies, wherein the plurality of routing lines are communicatively coupled to the plurality of interconnects of the plurality of smart dies, wherein each of the plurality of dies has at least two or more routing lines to communicatively couple the plurality of dies together, and wherein one of the routing lines is via the plurality of interconnects of the plurality of smart dies.

In example 2, the subject matter of example 1 can optionally include that the plurality of capacitors are a plurality of metal-insulator-metal (MIM) capacitors.

In example 3, the subject matter of examples 1-2 can optionally include that the plurality of dies are a plurality of active dies.

In example 4, the subject matter of examples 1-3 can optionally include that the plurality of active dies are a plurality of system on chip (SoC) dies.

In example 5, the subject matter of examples 1-4 can optionally include that the plurality of dies include a first die and a second die.

In example 6, the subject matter of examples 1-5 can optionally include that the plurality of smart dies include a first smart die and a second smart die, and wherein the plurality of routing lines communicatively couples the first and second dies to the first and second smart dies.

In example 7, the subject matter of examples 1-6 can optionally include that the plurality of routing lines include a first routing line, a second routing line, a third routing line, and a fourth routing line, and wherein the fourth routing line is coupled to the first die and the second die.

In example 8, the subject matter of examples 1-7 can optionally include that the first smart die has a first interconnect coupled to the first routing line and the second routing line, and wherein the second smart die has a second interconnect coupled to the second routing line and the third routing line.

In example 9, the subject matter of examples 1-8 can optionally include that the first interconnect of the first smart die couples the first die to the second interconnect of the second smart die with the first and second routing lines, and wherein the second interconnect of the second smart die couples the first interconnect of the first smart die to the second die with the second and third routing lines.

In example 10, the subject matter of examples 1-9 can optionally include that the first die includes a double date rate (DDR) bus and a peripheral component interconnect express (PCIe) bus, and wherein the second die is communicatively coupled to the DDR and PCIe busses of the first die via the first and second interconnects of the first and second smart dies.

In example 11, the subject matter of examples 1-10 can optionally include an underfill material surrounding portions of the plurality of dies and the plurality of smart dies; a plurality of thermal interface materials (TIMs) over the plurality of dies and the plurality of smart dies; and an integrated heater spreader (IHS) over the plurality of TIMs.

In example 12, the subject matter of examples 1-11 can optionally include that the TIMs on the plurality of dies have a thickness that is substantially equal to a thickness of the TIMs on the plurality of smart dies, and wherein the plurality of capacitors of the plurality of smart dies have a thickness that is substantially equal to a thickness of the plurality of dies.

Example 13 is a semiconductor package, comprising: a plurality of dies on a package substrate; a plurality of smart dies on the package substrate, wherein the plurality of smart dies include a plurality of interconnects, a plurality of capacitors, a plurality of substrates, and a plurality of encapsulation layers; and a plurality of routing lines coupled to the plurality of dies and the plurality of smart dies, wherein the plurality of routing lines are communicatively coupled to the plurality of interconnects of the plurality of smart dies, wherein each of the plurality of dies has at least two or more routing lines to communicatively couple the plurality of dies together, and wherein one of the routing lines is via the plurality of interconnects of the plurality of smart dies.

In example 14, the subject matter of example 13 can optionally include that the plurality of capacitors are a plurality of multilayered ceramic chip (MLCC) capacitors, wherein the plurality of dies are a plurality of active dies, and wherein the plurality of active dies are a plurality of SoC dies.

In example 15, the subject matter of examples 13-14 can optionally include that the plurality of substrates of the plurality of smart dies are on the package substrate, wherein the plurality of capacitors are on the plurality of substrates, wherein the plurality of encapsulation layers are over the plurality of capacitors and the plurality of substrate, and wherein the encapsulation layers embed the plurality of capacitors on the plurality of substrates.

In example 16, the subject matter of examples 13-15 can optionally include that the plurality of dies include a first die and a second die, wherein the plurality of smart dies include a first smart die and a second smart die, and wherein the plurality of routing lines communicatively couples the first and second dies to the first and second smart dies.

In example 17, the subject matter of examples 13-16 can optionally include that the plurality of routing lines include a first routing line, a second routing line, a third routing line, and a fourth routing line, wherein the fourth routing line is coupled to the first die and the second die, wherein the first smart die has a first interconnect coupled to the first routing line and the second routing line, wherein the second smart die has a second interconnect coupled to the second routing line and the third routing line, wherein the first interconnect of the first smart die couples the first die to the second interconnect of the second smart die with the first and second routing lines, wherein the second interconnect of the second smart die couples the first interconnect of the first smart die to the second die with the second and third routing lines, wherein the first die includes a DDR bus and a PCIe bus, and wherein the second die is communicatively coupled to the DDR and PCIe busses of the first die via the first and second interconnects of the first and second smart dies.

In example 18, the subject matter of examples 13-17 can optionally include an underfill material surrounding portions of the plurality of dies and the plurality of smart dies; a plurality of TIMs over the plurality of dies and the encapsulation layers of the plurality of smart dies; and an IHS over the plurality of TIMs.

In example 19, the subject matter of examples 13-18 can optionally include that the TIMs of the plurality of dies have top surfaces that are substantially coplanar to top surfaces of the TIMs of the plurality of smart dies.

Example 20 is a semiconductor package, comprising: a plurality of first dies on a package substrate; a plurality of second dies on the package substrate, wherein the plurality of second dies include a plurality of interconnects; and a plurality of routing lines coupled to the plurality of first dies and the plurality of second dies, wherein the plurality of routing lines are communicatively coupled to the plurality of interconnects of the plurality of second dies, wherein each of the plurality of first dies has at least two or more routing lines to communicatively couple the plurality of first dies together, and wherein one of the routing lines is via the plurality of interconnects of the plurality of second dies.

In example 21, the subject matter of example 20 can optionally include that the plurality of first dies are a plurality of active dies, wherein the plurality of second dies are a plurality of continuation dies, wherein the plurality of active dies are a plurality of SoC dies, wherein the plurality of first dies include a first active die and a second active die, wherein the plurality of second dies include a first continuation die and a second continuation die, wherein the plurality of routing lines communicatively couples the first and second active dies to the first and second continuation dies, wherein the plurality of routing lines include a first routing line, a second routing line, a third routing line, and a fourth routing line.

In example 22, the subject matter of examples 19-21 can optionally include that the first continuation die has a first interconnect coupled to the first routing line and the second routing line, wherein the second continuation die has a second interconnect coupled to the third routing line and the fourth routing line, wherein the first interconnect of the first continuation die couples the first active die to the second active die with the first and second routing lines, and wherein the second interconnect of the second continuation die couples the second active die to the first active die with the third and fourth routing lines.

In example 23, the subject matter of examples 19-22 can optionally include that the first active die includes a DDR bus and a PCIe bus, and wherein the second active die is communicatively coupled to the DDR and PCIe busses of the first active die via the first and second interconnects of the first and second continuation dies.

In example 24, the subject matter of examples 19-23 can optionally include that an underfill material surrounding portions of the plurality of first dies and the plurality of second dies; a plurality of TIMs over the plurality of first dies and the plurality of second dies; and an IHS over the plurality of TIMs.

In example 25, the subject matter of examples 19-24 can optionally include that the TIMs on the plurality of first dies have a thickness that is substantially equal to a thickness of the TIMs on the plurality of second dies.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A semiconductor package, comprising:
a plurality of dies on a package substrate;
a plurality of dummy dies on the package substrate, wherein the plurality of dummy dies include a plurality of interconnects and a plurality of capacitors, each of the plurality of interconnects continuous along a first direction and a second direction, the second direction orthogonal to the first direction; and
a plurality of routing lines coupled to the plurality of dies and the plurality of dummy dies, wherein the plurality of routing lines are communicatively coupled to the plurality of interconnects of the plurality of dummy dies, wherein each of the plurality of dies has at least two or more routing lines to communicatively couple the plurality of dies together, and wherein one of the routing lines is via the plurality of interconnects of the plurality of dummy dies.

2. The semiconductor package of claim 1, wherein the plurality of capacitors are a plurality of metal-insulator-metal (MIM) capacitors.

3. The semiconductor package of claim 1, wherein the plurality of dies are a plurality of active dies.

4. The semiconductor package of claim 3, wherein the plurality of active dies are a plurality of system on chip (SoC) dies.

5. The semiconductor package of claim 1, wherein the plurality of dies include a first die and a second die.

6. The semiconductor package of claim 5, wherein the plurality of dummy dies include a first dummy die and a second dummy die, and wherein the plurality of routing lines communicatively couples the first and second dies to the first and second dummy dies.

7. The semiconductor package of claim 6, wherein the plurality of routing lines include a first routing line, a second routing line, a third routing line, and a fourth routing line, and wherein the fourth routing line is coupled to the first die and the second die.

8. The semiconductor package of claim 7, wherein the first dummy die has a first interconnect coupled to the first routing line and the second routing line, and wherein the second dummy die has a second interconnect coupled to the second routing line and the third routing line.

9. The semiconductor package of claim 8, wherein the first interconnect of the first dummy die couples the first die to the second interconnect of the second dummy die with the first and second routing lines, and wherein the second interconnect of the second dummy die couples the first interconnect of the first dummy die to the second die with the second and third routing lines.

10. The semiconductor package of claim 9, wherein the first die includes a double date rate (DDR) bus and a peripheral component interconnect express (PCIe) bus, and wherein the second die is communicatively coupled to the DDR and PCIe busses of the first die via the first and second interconnects of the first and second dummy dies.

11. The semiconductor package of claim 1, further comprising:
an underfill material surrounding portions of the plurality of dies and the plurality of dummy dies;
a plurality of thermal interface materials (TIMs) over the plurality of dies and the plurality of dummy dies; and
an integrated heater spreader (IHS) over the plurality of TIMs.

12. The semiconductor package of claim 11, wherein the TIMs on the plurality of dies have a thickness that is substantially equal to a thickness of the TIMs on the plurality of dummy dies, and wherein the plurality of capacitors of the plurality of dummy dies have a thickness that is substantially equal to a thickness of the plurality of dies.

13. A semiconductor package, comprising:
a plurality of dies on a package substrate;
a plurality of dummy dies on the package substrate, wherein the plurality of dummy dies include a plurality of interconnects, a plurality of capacitors, a plurality of substrates, and a plurality of encapsulation layers, each of the plurality of interconnects continuous along a first direction and a second direction, the second direction orthogonal to the first direction; and
a plurality of routing lines coupled to the plurality of dies and the plurality of dummy dies, wherein the plurality of routing lines are communicatively coupled to the plurality of interconnects of the plurality of dummy dies, wherein each of the plurality of dies has at least two or more routing lines to communicatively couple the plurality of dies together, and wherein one of the routing lines is via the plurality of interconnects of the plurality of dummy dies.

14. The semiconductor package of claim 13, wherein plurality of capacitors are a plurality of multilayered ceramic chip (MLCC) capacitors, wherein the plurality of dies are a plurality of active dies, and wherein the plurality of active dies are a plurality of SoC dies.

15. The semiconductor package of claim 13, wherein the plurality of substrates of the plurality of dummy dies are on the package substrate, wherein the plurality of capacitors are on the plurality of substrates, wherein the plurality of encapsulation layers are over the plurality of capacitors and the plurality of substrate, and wherein the encapsulation layers embed the plurality of capacitors on the plurality of substrates.

16. The semiconductor package of claim 13, wherein the plurality of dies include a first die and a second die, wherein the plurality of dummy dies include a first dummy die and a second dummy die, and wherein the plurality of routing lines communicatively couples the first and second dies to the first and second dummy dies.

17. The semiconductor package of claim 16, wherein the plurality of routing lines include a first routing line, a second routing line, a third routing line, and a fourth routing line, wherein the fourth routing line is coupled to the first die and the second die, wherein the first dummy die has a first interconnect coupled to the first routing line and the second routing line, wherein the second dummy die has a second interconnect coupled to the second routing line and the third routing line, wherein the first interconnect of the first dummy die couples the first die to the second interconnect of the second dummy die with the first and second routing lines, wherein the second interconnect of the second dummy die couples the first interconnect of the first dummy die to the second die with the second and third routing lines, wherein the first die includes a DDR bus and a PCIe bus, and wherein the second die is communicatively coupled to the DDR and PCIe busses of the first die via the first and second interconnects of the first and second dummy dies.

18. The semiconductor package of claim 13, further comprising:
an underfill material surrounding portions of the plurality of dies and the plurality of dummy dies;
a plurality of TIMs over the plurality of dies and the encapsulation layers of the plurality of dummy dies; and
an IHS over the plurality of TIMs.

19. The semiconductor package of claim 18, wherein the TIMs of the plurality of dies have top surfaces that are substantially coplanar to top surfaces of the TIMs of the plurality of dummy dies.

20. A semiconductor package, comprising:
a plurality of first dies on a package substrate;
a plurality of second dies on the package substrate, wherein the plurality of second dies include a plurality of interconnects, each of the plurality of interconnects continuous along a first direction and a second direction, the second direction orthogonal to the first direction; and
a plurality of routing lines coupled to the plurality of first dies and the plurality of second dies, wherein the plurality of routing lines are communicatively coupled to the plurality of interconnects of the plurality of second dies, wherein each of the plurality of first dies has at least two or more routing lines to communicatively couple the plurality of first dies together, and wherein one of the routing lines is via the plurality of interconnects of the plurality of second dies.

21. The semiconductor package of claim 20, wherein the plurality of first dies are a plurality of active dies, wherein the plurality of second dies are a plurality of continuation dies, wherein the plurality of active dies are a plurality of SoC dies, wherein the plurality of first dies include a first active die and a second active die, wherein the plurality of second dies include a first continuation die and a second continuation die, wherein the plurality of routing lines communicatively couples the first and second active dies to the first and second continuation dies, wherein the plurality of routing lines include a first routing line, a second routing line, a third routing line, and a fourth routing line.

22. The semiconductor package of claim 21, wherein the first continuation die has a first interconnect coupled to the first routing line and the second routing line, wherein the second continuation die has a second interconnect coupled to the third routing line and the fourth routing line, wherein the first interconnect of the first continuation die couples the first active die to the second active die with the first and second routing lines, and wherein the second interconnect of the second continuation die couples the second active die to the first active die with the third and fourth routing lines.

23. The semiconductor package of claim 22, wherein the first active die includes a DDR bus and a PCIe bus, and wherein the second active die is communicatively coupled to the DDR and PCIe busses of the first active die via the first and second interconnects of the first and second continuation dies.

24. The semiconductor package of claim 20, further comprising:
  an underfill material surrounding portions of the plurality of first dies and the plurality of second dies;
  a plurality of TIMs over the plurality of first dies and the plurality of second dies; and
  an IHS over the plurality of TIMs.

25. He semiconductor package of claim 24, wherein the TIMs on the plurality of first dies have a thickness that is substantially equal to a thickness of the TIMs on the plurality of second dies.

* * * * *